(12) United States Patent
Soubirane et al.

(10) Patent No.: US 11,536,785 B2
(45) Date of Patent: Dec. 27, 2022

(54) MAGNETIC CARD READER WITH TUNNEL MAGNETORESISTANCE SENSOR

(71) Applicant: BANKS AND ACQUIRERS INTERNATIONAL HOLDING, Paris (FR)

(72) Inventors: Alain Soubirane, Bourg-les-Valence (FR); André Carabelli, Saint-Peray (FR); Thierry Marsaud, Talence (FR); Alain Coussieu, Flaviac (FR); Stéphane Pavageau, La Roche de Glun (FR)

(73) Assignee: BANKS AND ACQUIRERS INTERNATIONAL HOLDING, Paris (FR)

(*) Notice: Subject to any disclaimer, the term of this patent is extended or adjusted under 35 U.S.C. 154(b) by 26 days.

(21) Appl. No.: 16/961,122

(22) PCT Filed: Jan. 11, 2019

(86) PCT No.: PCT/EP2019/050714
§ 371 (c)(1),
(2) Date: Jul. 9, 2020

(87) PCT Pub. No.: WO2019/138085
PCT Pub. Date: Jul. 18, 2019

(65) Prior Publication Data
US 2020/0348376 A1 Nov. 5, 2020

(30) Foreign Application Priority Data
Jan. 12, 2018 (FR) .................................. 1850279

(51) Int. Cl.
*G01R 33/09* (2006.01)
*G06K 7/08* (2006.01)

(52) U.S. Cl.
CPC ......... *G01R 33/098* (2013.01); *G01R 33/091* (2013.01); *G06K 7/084* (2013.01)

(58) Field of Classification Search
CPC ........................... G01R 33/098; G01R 33/091
See application file for complete search history.

(56) References Cited

U.S. PATENT DOCUMENTS

| 2011/0278359 A1 | 11/2011 | Kasai et al. |
| 2013/0228622 A1* | 9/2013 | Hopt ............. G11B 5/255 235/449 |

(Continued)

FOREIGN PATENT DOCUMENTS

| CN | 102831708 | * 12/2012 |
| CN | 103576101 A | 2/2014 |
| JP | 2015200551 A | 11/2015 |

OTHER PUBLICATIONS

International Search Report and Written Opinion dated Mar. 12, 2019 for corresponding International Application No. PCT/EP2019/050714, filed Jan. 11, 2019.

(Continued)

*Primary Examiner* — Reena Aurora
(74) *Attorney, Agent, or Firm* — David D. Brush; Westman, Champlin & Koehler, P.A.

(57) ABSTRACT

A magnetic card reader comprising a groove for shifting of a magnetic card and a magnetic read head mounted on a first printed-circuit board so as to enable reading of a magnetic stripe of the magnetic card. The magnetic read head has a tunnel magnetoresistance sensor called a TMR magnetic sensor positioned in a recess of a side wall of the groove.

20 Claims, 2 Drawing Sheets

(56) References Cited

U.S. PATENT DOCUMENTS

2015/0097033 A1  4/2015 Yanko et al.
2018/0150656 A1* 5/2018 Kuwaki .............. G06K 7/0021
2019/0243992 A1* 8/2019 Carabelli .............. G06K 7/087

OTHER PUBLICATIONS

Written Opinion of the International Searching Authority dated Mar. 12, 2019 for corresponding International Application No. PCT/EP2019/050714, filed Jan. 11, 2019.
English translation of the Written Opinion of the International Searching Authority dated Mar. 20, 2019 for corresponding International Application No. PCT/EP2019/050714, filed Jan. 11, 2019.

* cited by examiner

MAGNETIC CARD READER WITH TUNNEL MAGNETORESISTANCE SENSOR

CROSS-REFERENCE TO RELATED APPLICATIONS

This Application is a Section 371 National Stage Application of International Application No. PCT/EP2019/050714, filed Jan. 11, 2019, which is incorporated by reference in its entirety and published as WO 2019/138085 A1 on Jul. 18, 2019, not in English.

1. FIELD OF THE INVENTION

The present invention relates to the field of the reading of magnetic cards. Its object more particularly is a magnetic card reader comprising a tunnel magnetoresistance sensor. Such a magnetic card reader offers advantages in terms of compactness and securing, and can especially be used within a payment terminal.

2. PRIOR ART

Many devices rely on the reading of a magnetic card (also known as a magnetic stripe card) to provide a service or deliver an authorization. A magnetic card remains for example a payment means that is very widespread in many countries, and electronic payment terminals are therefore often equipped with a magnetic card reader used to read the information present on the magnetic stripe of a customer's magnetic card, and thus enable the payment to be made. A magnetic card reader classically comprises a groove intended to guide the movement of a magnetic card in the reader as well as a magnetic reader head or read head associated with a printed-circuit. When the card is swiped in the groove of the magnetic stripe reader (for example from top to bottom), the magnetic stripe of the card moves before the read head. This mobile magnetic stripe, which contains magnetic domains of alternating polarity, then generates a magnetic field in the narrow detection aperture (air gap) of the read head. The read head converts the variations of this magnetic field into an electrical signal. The printed-circuit board associated with the read head comprises for example a decoding circuit that amplifies and digitizes the electrical signal, thus enabling the recreation of the same data sequence as the one originally recorded on the magnetic stripe (by interpretation of a succession of long and short intervals). The data of the magnetic card are thus obtained and they can be exploited to implement an appropriate processing within the device integrating the magnetic card reader.

A read head usually employed in a magnetic card reader comprises for example a core made of soft ferromagnetic material comprising a narrow air gap (the air gap forming the detection aperture of the magnetic read head) and a coil wound about this core. During the translational motion of the magnetic card in the groove of the reader, one extremity of the magnetic read head comes into physical contact with the magnetic stripe of the magnetic card. The magnetic card then exerts pressure on the magnetic read head. The read head must therefore be capable of shifting perpendicularly to the axis of translation of a card in the groove. To enable this shifting, a magnetic read head is generally mounted on a holding device as illustrated for example in the patent application FR3037689. Broadly speaking, the term "read head" often covers the assembly comprising the read head in itself, a holding device (magnetic head support) on which it is fixed and a printed-circuit board for connection to the rest of the device, often comprising a flexible part. The holding device stabilizes the magnetic read head during the reading of the card and especially limits the tilting of the read head that can be induced by the passage of a magnetic card into the reader and, at the same time, enables the magnetic read head to return to its original position.

One drawback of read heads currently used in magnetic card readers lies in their thickness. Although progress has been made in this field, the read heads of these readers have not attained the same degree of miniaturization as most of the other electronic components used. The result of this is that the thickness of these read heads—which is of the order of several millimeters, at least three millimeters for the thinnest read heads used in present-day readers—constitutes a non-negligible restrictive factor when designing highly integrated and more compact memory card readers. This constraint related to the thickness of present-day read heads also raises problems of security. Indeed, such a thickness offers opportunities of fraud to malicious individuals: the thicker the magnetic card reader, the greater the possibilities of installing a fraudulent read device in this reader, enabling the discreet retrieval of the data from a magnetic card without its owner's knowledge.

There is therefore a need for magnetic card readers that are at the same time more compact and better secured, and that do not have at least some of the drawbacks explained here above.

3. SUMMARY

The proposed technology relates to a magnetic card reader that does not have these drawbacks of the prior art. Such a magnetic card reader comprises a groove for the shifting of a magnetic card and a magnetic read head mounted on a first printed-circuit board (possibly flexible) so as to enable the reading of a magnetic stripe of the magnetic card. According to the proposed technique, the magnetic read head comprises a tunnel magnetoresistance sensor positioned in a recess of a side wall of said groove. The sensor is optimally positioned to pick up the magnetic field in the direction of passage of the card. It will be noted that positioning the sensor so as to pick up a magnetic field that is normal (perpendicular) to the track has advantages as regards the reading distance.

For purposes of simplification, the tunnel magnetoresistance sensor is designated here below in this document by the more concise term TMR magnetic sensor (TMR being the usual acronym for tunnel magnetoresistance).

In this way, a magnetic card reader is implemented that is more compact than prior-art magnetic card readers through the use of a TMR magnetic sensor characterized by its small thickness. At the same time this sensor is protected from mechanical shocks by being positioned within a recess of a side wall of the groove for the movement of a magnetic card within the reader. The magnetic card reader thus has increased security inasmuch as the space that can be used by a fraudulent individual to insert a fraudulent read head within the groove of the sensor is considerably reduced.

According to a first implementation of the magnetic card reader, the side wall takes the form of a wall made of plastic at least partially overlaying said first printed-circuit board, said recess being a passage recess (i.e. a through recess) of said side wall.

Thus, with this first implementation, a first protection of the TMR magnetic sensor is implemented very simply but nevertheless efficiently through the overlaying of the first printed-circuit board by a side wall made of plastic. The recess is then a through recess that enables the creation of a housing within which the magnetic read head mounted on the first printed-circuit board can take position and be protected. The recess is especially designed so that no "step" hinders the swiping of the card. Indeed, such steps are liable to create variations in the speed of the magnetic card when it is being moved in the groove, and this may disturb the decoding of the information of the magnetic track (for example during a slowing down of the card, a lengthy interval is liable to be interpreted by a short interval).

According to one particular characteristic of this first implementation, said side wall is made of dissipative plastic, said first printed-circuit board comprising at least one electrostatic discharge track in contact with said side wall.

In this way, the electrostatic charges potentially generated by the motion of the magnetic card in the groove are removed, gently, towards areas of the reader showing low sensitivity towards the static electricity before the magnetic card comes into a position facing the TMR magnetic sensor. Thus this sensor, which is particularly sensitive to electrostatic discharges, is prevented from being damaged.

According to a second implementation of the magnetic card reader, the side wall is formed at least partially by said first printed-circuit board, said recess being a blind recess of said first printed-circuit board.

Thus, with this second implementation, it is possible to obtain an even more compact magnetic card reader since the first printed-circuit board itself acts as one of the walls of the groove for the shifting of a magnetic card. The TMR magnetic sensor then takes position within a recess of the first printed-circuit board. In this way, the overall securing of the magnetic card reader against the installation of a fraudulent magnetic reader head is further increased since the space that can be exploited to implement such a fraud is further reduced.

According to one particular characteristic of this second implementation, said first printed-circuit board comprises a protective element extending over a major part of the first printed-circuit board, about said recess.

Thus, the exploitable space for the installation of a fraudulent magnetic read head in the reader is further reduced. Indeed, the protection element enables the detection of any attempt to hollow out the surface of the first printed-circuit board in order to position such a fraudulent read head therein. The protective element can especially take the form of a protective lattice integrated into an internal layer of the first printed-circuit board, close to the surface forming one of the sides of the groove, extending over a major part of this surface, about the recess.

According to another particular characteristic of this second implementation, said first printed-circuit board comprises at least one electrostatic discharge track about said recess.

This track is disposed on the surface of the first printed-circuit board, on the groove side. Thus, the electrostatic charges potentially generated by the movement of the magnetic card in the groove are discharged towards areas of the reader showing low sensitivity to the static electricity before the magnetic card comes to face the TMR magnetic sensor. Thus this sensor, which is particularly sensitive to electrostatic discharges, is prevented from being damaged. In addition, these tracks are sized and shaped so as to favor the swiping of the magnetic card on the first printed-circuit board (which, according to the second implementation, forms one of the walls of the groove), during the shifting of the magnetic card in the groove.

According to one particular embodiment, said first printed-circuit board comprises at least one electrostatic discharge track positioned in said recess, about said TMR magnetic sensor.

In this way, the residual electrostatic charges that have not yet been discharged by other magnetic discharge tracks potentially present upstream to the TMR magnetic sensor are directed towards areas of the reader having low sensitivity to static electricity before the magnetic card comes to face the TMR magnetic sensor. Thus, this sensor which is particularly sensitive to electrostatic discharges is prevented from getting damaged.

According to one particular embodiment, said magnetic read head consists of said TMR magnetic sensor.

In this way, the magnetic read head is reduced to a single component of small thickness (of the order of half a millimeter), soldered to the first printed-circuit board. Thus, a particularly compact and secure magnetic card reader is implemented.

According to another particular embodiment, said magnetic read head comprises, in addition to said TMR magnetic sensor:
  a second printed-circuit board comprising a reception portion on which there is mounted said TMR magnetic sensor, and a connecting portion for the electrical connection of said magnetic read head;
  a holding device, fixedly attached to said reception portion, said holding device comprising affixing means for the mechanical affixing of said magnetic read head.

In this way, the magnetic read head is no longer limited to the TMR magnetic sensor alone but consists of a magnetic read head in the broad sense of the term that also comprises a second printed-circuit board that is proper to it, enabling especially its electrical connection to the first printed-circuit board, as well as a holding device enabling especially its mechanical affixation to the first printed-circuit board (or to another point of the reader). In particular, the reception portion can take the form of a rigid printed-circuit board with dimensions of about one centimeter by one centimeter, the connecting portion can take the form of a flexible printed-circuit board and the holding device can take the form of a metallic strip soldered to the reception portion. In this way, the read head according to the proposed technique can be shaped and sized so that its shape and its dimensions correspond to those of a classic read head. An appropriate management of the output signal delivered by such a magnetic read head then enables it to be made compatible with existing equipment. Such a magnetic read head with TMR magnetic sensor can for example be used to replace a faulty classic magnetic read head within an older-generation payment terminal.

According to one particular embodiment, the magnetic card reader further comprises an element for overlaying said TMR magnetic sensor.

In this way, the protection of the TMR magnetic sensor already implemented by means of the recess and electrostatic discharge tracks provided, if any, is complemented by an additional protection more particularly centered on a protection of the upper part of the TMR magnetic sensor (i.e. the part of the TMR magnetic sensor that is situated facing a magnetic card during its reading).

According to a first particular characteristic of this embodiment, said overlaying element is a polyimide film.

Thus, the TMR magnetic sensor is protected in a simple and efficient manner by using an overlaying element that is at the same time very thin, highly resistant and impermeable to electrostatic discharges. In addition, implementing this overlaying element is very simple: the polyimide film is positioned so as to overlay the TMR magnetic sensor, and then the edges of this film are for example bonded to the printed-circuit board on which the TMR magnetic sensor is mounted, in a peripheral zone of said sensor. To this end, the polyimide film can be especially lined with an adhesive entirely or partly on at least one of its surfaces.

According to a second particular characteristic of this embodiment, said overlaying element takes the form of a protective capsule that encapsulates said TMR magnetic sensor, said capsule taking the form of a metallic cap or hood, or being formed by the injection of plastic material, resin or ceramic.

In this way, the TMR magnetic sensor is protected efficiently, especially against mechanical shocks and impacts, through the implementing of a protective capsule that is rigid and resistant. In the case of a protective capsule implemented by injection of material, the structural integrity of the read head can also be reinforced by injecting the material so as to integrate other elements in addition to the TMR magnetic sensor within the protective capsule thus formed (for example the second printed-circuit board and a part of the holding device, in the case of a read head comprising such elements).

In one particular implementation, said capsule is chamfered.

Thus, the chamfered part is used to guide and facilitate the swiping of a magnetic card that comes into contact with the upper part of the protective capsule during its shifting in the groove of the magnetic card reader. This especially prevents the presence of abrupt step features that could hamper the sliding of the card.

According to a third particular characteristic of this embodiment, said overlaying element takes the form of a folded-back portion in a flexible printed-circuit board on said TMR magnetic sensor.

In this way, the protection, especially the upper protection, of the TMR magnetic sensor can be implemented in a simple way without resorting to specific protection elements liable to cause increased production costs and increased complexity of the method for manufacturing the magnetic card reader. In particular, the folded-back portion can correspond to a fold of a flexible part of the first or second printed-circuit board.

In one particular implementation, said folded-back portion comprises at least one electrostatic discharge track.

Thus, the electrostatic charges liable to damage the TMR magnetic sensor can be discharged towards areas showing low sensitivity to static electricity of the reader during the shifting of a magnetic card in the groove of the magnetic card reader.

The different embodiments mentioned here above can be combined with each other.

4. DRAWINGS

Other features and advantages of the invention shall appear more clearly from the following description of a preferred embodiment given by way of simple, illustrative and non-exhaustive examples and from the appended drawings, of which:

FIG. 1 presents a partial view in section of a magnetic card reader according to a first implementation of the proposed technique;

FIG. 2 presents a partial view in section of a magnetic card reader according to a second implementation of the proposed technique;

5. DESCRIPTION 5.1. Preliminary Observations

Figure 1:
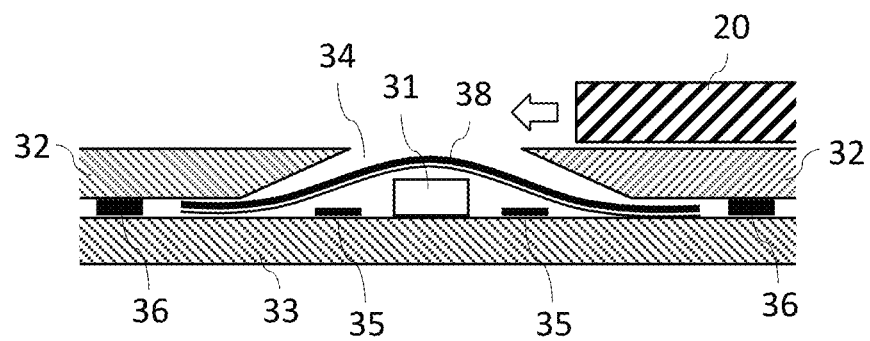

Throughout the description, the elements of a same nature are identified by a same numerical reference in the figures. As explained here above, the term "TMR magnetic sensor" is used throughout the present document to designate a tunnel-effect magnetoresistance sensor. A groove for the shifting of a magnetic card is formed by two side walls and by a bottom. For the purposes of simplification, only the side wall integrating the TMR magnetic sensor is represented in the figures. Similarly, any reference to "the side wall" in the present document must be understood as a reference to the side wall of the groove that integrates the TMR magnetic sensor. In addition, the terms "first printed-circuit board" and "second printed-circuit board" used in the present document are aimed solely at making it possible to establish a distinction between these two printed-circuit boards, and in no way imply the existence of any relationship of order between these printed-circuit boards.

5.2. General Principle

A magnetic card reader is proposed that comprises, classically, a groove for the shifting of a magnetic card and a magnetic read head mounted on a first printed-circuit board so as to enable the reading of a magnetic stripe of the magnetic card. The magnetic card reader according to the proposed technique is however distinguished from prior-art magnetic card readers in that the magnetic read head used comprises a tunnel magnetoresistance sensor also called a TMR magnetic sensor.

A TMR magnetic sensor is a sensor that exploits tunnel-effect or tunnel magnetoresistance to measure a magnetic field. Tunnel magnetoresistance (TMR) is a property that appears in a fine insulating membrane (with a thickness of the order of one to two nanometers)—called a tunnel junction—that separates two ferromagnetic materials. According to this property, the electrical resistance that counters the passage of the current by tunnel effect from one ferromagnetic material to the other through the insulating membrane fluctuates according to the relative orientation of the two magnetic layers formed by the ferromagnetic materials. This property is not the object as such of the technique as proposed and is therefore not described in greater detail in the present document. TMR magnetic sensors are known but the inventors have observed that their great mechanical fragility and their high sensitivity to electrostatic discharges has made them hitherto incapable use in difficult conditions such as those of magnetic card readers. By way of an illustration, several hundreds of thousands of card swipes can be made during the lifetime of a magnetic card reader of a payment terminal. Such a reader is therefore subjected to heavy mechanical stresses and strains. In addition, the movement of the card in the reader is a source of frequent electrostatic discharges within the terminal. The technical constraints entailed in the use of such TMR magnetic sensors within a magnetic card reader can thus be understood. Such sensors however have the advantage of having very small thickness as compared with the magnetic read heads classically used in magnetic card readers. Certain TMR magnetic sensors thus have a thickness smaller than half a millimeter as compared with thicknesses of several millimeters at best for classic magnetic read heads (thickness of the order of about three millimeters for the thinnest magnetic read heads presently used in magnetic card readers). TMR magnetic card readers also have the advantage of being less sensitive to distance (relative to the magnetic field to be measured) than a classic magnetic card reader (i.e. a TMR magnetic sensor does not need to be as "close" to the magnetic field to be measured as a classic magnetic read head).

It is therefore proposed in the present disclosure solutions aiming at surmounting the above-mentioned constraints, in describing means to implement a magnetic card reader that relies on the use of a TMR magnetic sensor as a magnetic read head for the reading of a magnetic card. According to the general principle of the proposed technique, such a TMR magnetic sensor is positioned in a recess of a side wall of the groove for shifting the magnetic card. Thus, it is possible to implement magnetic card readers that are more compact than those of the prior art and, incidentally, better secured (for the reasons explained especially in relation to the prior art). The sides of the recess offer a first protection, especially a side protection, of the TMR magnetic sensor. Various implementations are proposed, in order to ingeniously protect the TMR magnetic sensor against impacts or shocks and mechanical wear and tear as well as against the electrostatic discharges that may occur during the swiping of a magnetic card in the groove of the reader.

In a first implementation of a magnetic card reader, illustrated with reference to FIG. 1, the side wall takes the form of a wall made of plastic material 32 that at least partially overlays the first printed-circuit board 33, on which the magnetic read head 31 is mounted. The TMR magnetic sensor 31 then takes position in a through-recess (passage recess) 34 of the side wall 32. The recess 34 can especially take the form of a cone with a base that is wider on the side of the first printed-circuit board 33. Thus, space is released on the first printed-circuit board 33 to install components with the TMR magnetic sensor 31 while enabling optimal protection of the TMR magnetic sensor. In this way, the side wall 32 forms a plastic cap that especially favors the swiping of a magnetic card 30 when it is shifted in the groove. In different embodiments, electrical tracks are provided on the first printed-circuit board 33 to protect the TMR magnetic sensor 31 against the static electricity generated especially during the swiping of a card in the reader. Such electrical tracks act as ground "drains" enabling the electrostatic charges to be discharged towards low-sensitivity areas of the reader, thus preventing damage to the TMR magnetic sensor. In one particular embodiment, electrostatic discharge tracks 35 are thus positioned about the TMR magnetic sensor, in the recess 34. These tracks can especially be disposed on either side of the sensor in the axis of shift of the magnetic card within the groove, so as to make sure that such a track is always present upstream to the TMR magnetic sensor whatever the sense of shift of the card in the groove. As an alternative or in a complementary way, in another particular embodiment, the side wall 32 is formed out of dissipative plastic material and electrostatic discharge tracks 35 present in the first printed-circuit board 33 are positioned outside the recess 34 so that, in areas known as areas for restoring contact, they are in contact with the side wall 32, here too in order to favor the discharge of electrostatic charges.

In a second implementation, illustrated with reference to FIG. 2, the side wall is formed at least partially by the first printed-circuit board 33. In this case, the recess 34 within which the TMR magnetic sensor is positioned is a blind recess made in the first printed-circuit board 33, i.e. in a non-through (i.e. non-passage) recess. In one particular embodiment, the first printed-circuit board 33 furthermore comprises a protective element 39 that extends on a major part of the first printed-circuit board 33 about the recess 34. Advantageously, this protective element 39 takes the form of a protective lattice extending on an internal layer of the first printed-circuit board 33, close to the groove. Such a protective element especially enables the detection of any attempt at fraud that would consist in hollowing out the first printed-circuit board 33 in order to insert a fraudulent magnetic read head therein, and enables the implementing of appropriate protective measures (alarm, deactivating the magnetic card reader, etc.). The fact that the TMR magnetic sensor is inserted into such a blind hole of the first printed-circuit board (i.e. in a cavity of the printed-circuit board) makes it possible especially to place such a protective lattice as close as possible to the groove of the magnetic card reader, i.e. as close as possible to the area of shift of the magnetic card, and therefore makes it possible to considerably limit the thickness available to place a fraudulent magnetic head in the reader.

In one particular embodiment, the surface of the printed-circuit board 33 comprises, on the groove side and about the recess 34, at least one electrostatic discharge track 37. These tracks 37 make it possible to electrically discharge a magnetic card 20 when it is being shifted in the groove, before it is situated facing the TMR magnetic sensor 1. These tracks can especially take the form of a ground plane having very high resistance to wear and tear, thus also favoring the swiping of the card 20 directly on the first printed-circuit board, in the groove. As in the first implementation, electrostatic discharge tracks 35 can also be disposed, as an alternative or in a complementary way, in the recess itself, about the TMR magnetic sensor 31, for example on either side of this sensor in the axis of shift of the magnetic card within the groove.

Figure 2:
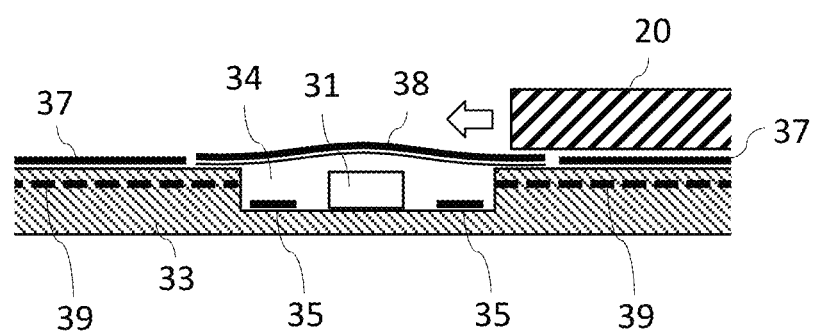

The two implementations presented with reference to FIGS. 1 and 2 have the advantage, relative to the prior-art magnetic card readers, of substantially complicating the installation of a fraudulent magnetic card reader in the reader. Indeed, the height of the recess is appreciably equal to the thickness of a TMR magnetic sensor which is, for the thinnest sensors, of the order of half a millimeter. A malicious individual will therefore have only a very small thickness available to try to install a fraudulent magnetic read head and the components needed to connect it to a recording device. The installation of a protective element (for example a lattice) within the wall also further limits the space available to implement such fraud, by reducing the thickness that can be exploited by a malicious individual to two-tenths or three-tenths of a millimeter. It will be understood therefore that a magnetic card reader according to the proposed technique is more secure than prior-art magnetic card readers which integrate a classic magnetic read head having several millimeters of thickness.

Different particular embodiments are now presented of a magnetic card reader according to the proposed technique, that can be implemented equally well in the context of either of the two implementations described here above. These additional embodiments in certain cases relate to the very structure of the magnetic read head used in the magnetic card reader and in other cases they relate to different ways of implementing a complementary protection of the TMR magnetic sensor of the magnetic read head, using a overlaying element.

5.3. Nature of the Magnetic Read Head

In one particular embodiment, the magnetic read head of the magnetic card reader is constituted solely by (i.e. consists of) the TMR magnetic sensor (as is illustrated especially in the examples of FIGS. 1 and 2 where the TMR magnetic sensor TMR 31 is directly soldered to the first printed-circuit board and forms the magnetic read head.

However, in another particular embodiment, examples of which are illustrated with reference to FIGS. 3 and 4, a "classic" magnetic read head is built out of a TMR component. More particularly, the magnetic read head comprises, in addition to the TMR magnetic sensor 31, its own printed-circuit board 50 (called a "second" printed-circuit board in the present document, for purposes of differentiation from the "first" printed-circuit board defined here above, which is the printed-circuit board on which the magnetic read head is mounted) as well as a holding device 51. The second printed-circuit board 50 comprises a reception portion 501 on which the TMR magnetic sensor 31 is mounted and a connecting portion 502 for the electrical connection of the magnetic read head. The holding device 51 is fixedly attached to the reception portion 501 and it comprises means of affixation and a spring system for the mechanical affixation of the magnetic read head.

In particular, the reception portion 501 can take the form of a rigid printed-circuit board taking the form of a substantially square-shaped plate with a side of about one centimeter and the connecting portion can take the form of a flexible printed-circuit board enabling for example the electrical connection of the second printed-circuit board 50 to the first printed-circuit board. The holding device 51 can take the form of a metallic strip soldered to the reception portion 501. Thus, the TMR read head can be shaped and sized so that its shape and its dimensions correspond to those of a classic read head. In particular, the holding device 51 can take a shape similar to that of an existing holding device. Thus, one has a magnetic read head that is of a new generation—because it makes use of tunnel magnetoresistance to measure the magnetic field—but remains compatible with the existing equipment originally designed to receive classic read heads (provided of course that there is an appropriate management of the output signal delivered by such a magnetic read head). More particularly, the metal strip 51 is then shaped and sized, on the one hand so as to enable the affixation of the TMR magnetic read head to a classic read head location and, on the other hand, to maintain the TMR magnetic sensor 31 at a height limiting the space between the sensor and the magnetic stripe of a magnetic card when such a card is shifted in the groove of the reader, so as to enable its reading.

Figure 3:
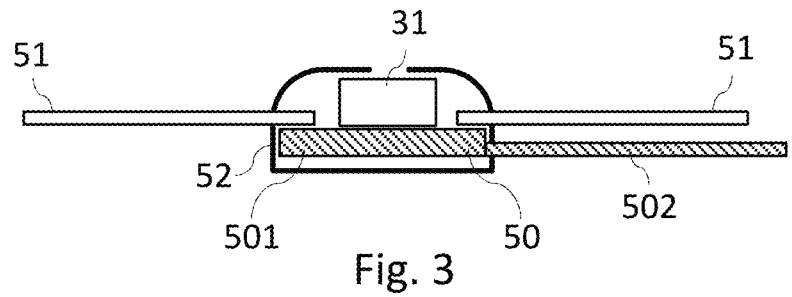
FIG. 3 shows a first example of a magnetic read head in the broad sense of the term in one particular embodiment.
Figure 4:
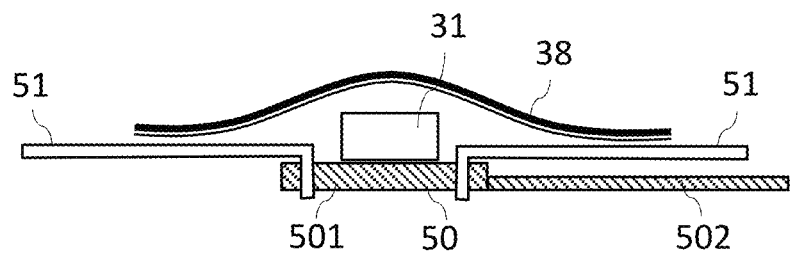
FIG. 4 shows a second example of a magnetic read head in the broad sense of the term in another particular embodiment.

The soldering of the metallic strip 51 to the reception portion 501 of the second printed-circuit board 50 can be achieved by conventional means for soldering surface-mounted components (SMCs) for example by reflow soldering as illustrated in FIG. 3. As an alternative, the metal strip comprises folds that are intended to be inserted into complementary metal through-holes of the reception portion 501 and then soldered (this alternative, illustrated in FIG. 4, can be used especially to give greater robustness to the magnetic read head).

In the example of FIG. 3, in addition, the read head comprises a sheath, for example a metal capsule 52 or a capsule made of rigid plastic material that enables all the components (printed-circuit board, TMR magnetic sensor and metallic strip) to be unified in one and the same component capable of being used to replace existing components.

These embodiments according to which the magnetic read head comprises its own printed-circuit board (the second printed-circuit board 50) are also interesting inasmuch as they can be used to implement a magnetic read head that is secure by its very nature: indeed, lattice-type protection elements can be integrated directly into the external layers of the reception portion 501 and connecting portion 502 so as to secure the signals travelling through the magnetic read head (the securing then relates equally well to the signals conveying data and to signals used to electrically power the head). Although this is not shown in the figures, the magnetic read head in the broad sense as described with reference to the FIGS. 3 and 4 are of course compatible with the implementations described with reference to FIGS. 1 and 2, and they can on this basis be positioned in a recess of a side wall of the groove for shifting a magnetic card.

5.4. Overlaying Element

In one particular implementation, the magnetic card reader comprises an element for overlaying the TMR magnetic sensor. This overlaying element is intended to protect the TMR magnetic sensor, especially its upper part. The protection is mechanical and/or electrical. Various embodiments of such a overlaying element are presented here below.

In a first particular embodiment, the overlaying element is a polyimide film that integrally overlaps the TMR magnetic sensor. In the examples illustrated in FIGS. 1 and 2 in which the magnetic read head is constituted solely by the TMR magnetic sensor 31 directly soldered to the first printed-circuit board 33, such a polyimide film 38 is bonded at its periphery to the first printed-circuit board 33. In the example illustrated in FIG. 4, in which the magnetic read head takes the integrated form of a classic magnetic read head comprising, in addition to the TMR magnetic sensor 31, its own printed-circuit board 50 and a holding device 51, the polyimide film 38 is for example bonded at its periphery on the holding device 51. Such a polyimide film has numerous advantageous properties. On the one hand, it can be very thin (for example with a thickness of about 50 micrometers) while at the same time being highly resistant not only to mechanical stresses but also to climatic and chemical conditions. Thus, in particular it will not be easily detached once it is in position. On the other hand, polyimide is a material impermeable to electrostatic discharges. Such a polyimide film is therefore a protective element that is particularly suited to electrically protecting a TMR magnetic sensor, known to be a component particularly sensitive to electrostatic discharges. The path in air of such a protection will be all the greater as the overlay is substantial, further increasing the efficiency of such protection. According to one particular characteristic, the electrostatic discharge tracks 35 already presented with reference to FIGS. 1 and 2 can also be overlaid with the polyimide film 38 so as to prevent any residual electrostatic charge from flowing towards the TMR magnetic sensor 31.

In a second particular embodiment, an example of which is shown with reference to FIG. 3 already described, the overlaying element takes the form of a rigid protective capsule 52 that encapsulates the TMR magnetic sensor 31. The protective capsule 52 is for example a metal cap or hood resting on the printed-circuit board on which the TMR magnetic sensor is soldered, and overlaying this sensor. The protective capsule 52 can also be formed by an injection of plastic, resin (epoxy resin for example) or ceramic about the TMR magnetic sensor (the protective capsule can then possibly also encapsulate a part of the printed-circuit board to which the TMR magnetic sensor is soldered). According to one particular characteristic, and as can be seen in FIG. 3, the protective capsule 52 is especially chamfered in order to guide and facilitate the swiping of a magnetic card that comes into contact with the upper part of the protective capsule during its shifting in the groove of the magnetic card reader. Besides, such a capsule also offers the advantage of being resistant to friction from different magnetic cards: this capsule thus gives increased longevity. Although illustrated solely with reference to FIG. 3, such a protective capsule can naturally be implemented to protect a read head constituted solely by a TMR magnetic sensor directly soldered to the first printed-circuit board as represented in FIG. 1 or 2.

Figure 5:
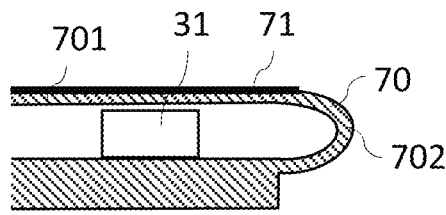
FIG. 5 illustrates an example of implementation of a magnetic card reader in another particular embodiment.

In a third particular embodiment, illustrated with reference to FIG. 5, the overlaying element takes the form of a fold 701 of a flexible printed-circuit board 70 on the TMR magnetic sensor 31. In particular, this fold can be formed by a folded-back portion of a flexible part of the first printed-circuit board (the first printed-circuit board 33 of FIGS. 3 and 4, when the magnetic read head is constituted by a TMR magnetic sensor alone) or of the second printed-circuit board (the second printed-circuit board 50 of FIGS. 5 and 6, when the TMR magnetic read head is implemented in its broad form, including a holding device and a printed-circuit board that is proper to it in order to be shaped and sized as a classic prior-art magnetic read head). To limit the mechanical strains and stresses exerted by repeated swipes of the magnetic card in the groove on the fold 702 enabling the forming of the folded-back portion 701, this fold 702 is preferably made so as to be parallel to the direction of shift of the magnetic card in the groove. This also limits the effects of "impacts" or "shocks" that could lead to an undesirable shifting of the printed-circuit board equipped with the TMR magnetic sensor in the sense of swiping of the magnetic card, such a shift being likely to compromise the accurate decoding of information of the magnetic track of the card. The implementing of the overlaying element in the form of a folded-back portion of a printed-circuit board is advantageous inasmuch as it makes it possible, according to one particular characteristic, to directly integrate electrostatic discharge tracks 71 on the folded-back portion, as illustrated in FIG. 5. As already described here above, these tracks act as ground "drains" that discharge the electrostatic charges liable to damage the TMR magnetic sensor towards areas less sensitive to electrostatic discharges.

According to some embodiments, it is also envisaged the combining of several overlaying elements (for example positioning a polyimide film above a protective capsule) in order to benefit simultaneously from the advantages proper to each overlaying element used (for example to cumulate the mechanical resistance of a protective capsule and the impermeability to electrostatic discharges of a polyimide film).

Figure 6:
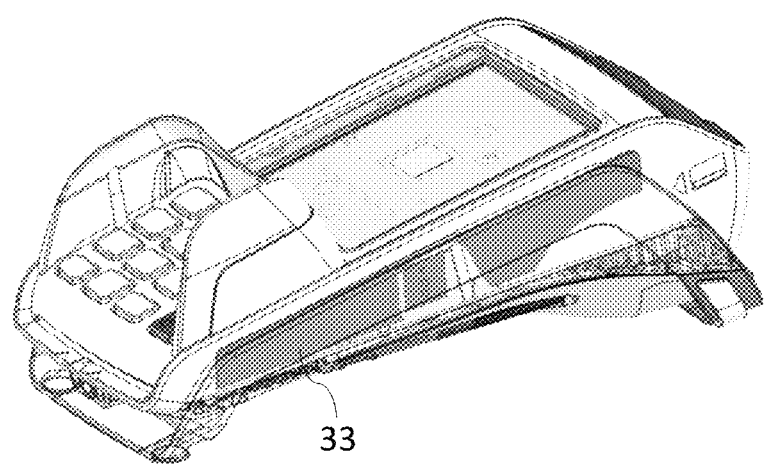
FIG. 6 is a schematic representation of a payment terminal comprising a magnetic card reader in one particular embodiment of the proposed technique.

The magnetic card reader according to the proposed technique can advantageously, in its different embodiments described here above, be implemented within a payment terminal as illustrated schematically with reference to FIG. 6. In particular, the first printed-circuit board 33, on which the magnetic read head is mounted, can extend the major part of one of the side walls of the groove for shifting a magnetic card. The joint implementation of such a printed-circuit board, comprising a protective lattice which then extends over a major part of the shifting groove, with the magnetic read head comprising a TMR magnetic sensor, thus enables a high-level integration of the magnetic card reader within the payment terminal, offering a solution that is both more secure and more compact than prior-art solutions.

Although the different embodiments presented the present description and the drawings that accompany it provide a description, by way of an illustration, of a magnetic card reader comprising a single TMR magnetic sensor, it is of course possible without departing from the framework of the proposed technique to jointly use several TMR magnetic sensors within one and the same magnetic card reader, for example in order to pick up the different magnetic fields generated by the different tracks of a multi-track magnetic card.

The invention claimed is:

1. A magnetic card reader comprising:
 a groove configured to enable shifting of a magnetic card in the groove; and
 a magnetic read head mounted on a first printed-circuit board so as to enable reading of a magnetic stripe of the magnetic card, wherein said magnetic read head comprises a tunnel magnetoresistance sensor called a TMR magnetic sensor positioned in a passage recess of a side wall of said groove, said side wall taking the form of a wall made of dissipative plastic at least partially overlaying said first printed-circuit board, said first printed-circuit board comprising at least one electrostatic discharge track in contact with said side wall.

2. The magnetic card reader according to claim 1, wherein said magnetic read head consists of said TMR magnetic sensor.

3. The magnetic card reader according to claim 1, wherein said magnetic read head comprises, in addition to said TMR magnetic sensor:
 a second printed-circuit board comprising a reception portion on which there is mounted said TMR magnetic sensor, and a connecting portion for electrical connection of said magnetic read head; and
 a holding device, fixedly attached to said reception portion, said holding device comprising a fixing element to mechanically fix said magnetic read head.

4. The magnetic card reader according to claim 1, further comprising an overlaying element overlaying said TMR magnetic sensor.

5. The magnetic card reader according to claim 4 wherein said overlaying element is a polyimide film.

6. The magnetic card reader according to claim 4 wherein said overlaying element takes the form of a protective capsule that encapsulates said TMR magnetic sensor, said capsule taking the form of a metallic cap, or being formed by injection of plastic material, resin or ceramic.

7. The magnetic card reader according to claim 6 wherein said capsule is chamfered.

8. The magnetic card reader according to claim 4 wherein said overlaying element takes the form of a folded-back portion of a flexible printed-circuit board on said TMR magnetic sensor.

9. The magnetic card reader according to claim 8 wherein said folded-back portion comprises at least one electrostatic discharge track.

10. A magnetic card reader comprising:
 a groove configured to enable shifting of a magnetic card in the groove; and
 a magnetic read head mounted on a first printed-circuit board so as to enable reading of a magnetic stripe of the magnetic card, wherein said magnetic read head comprises a tunnel magnetoresistance sensor called a TMR magnetic sensor positioned in a recess of a side wall of said groove, and wherein said side wall is formed at least partially by said first printed-circuit board, said recess being a blind recess of said first printed-circuit board.

11. The magnetic card reader according to claim 10 wherein said first printed-circuit board comprises a protective element extending over a major part of the first printed-circuit board, about said recess.

12. The magnetic card reader according to claim 10, wherein said first printed-circuit board comprises at least one electrostatic discharge track, about said recess.

13. The magnetic card reader according to claim 10, wherein said magnetic read head consists of said TMR magnetic sensor.

14. The magnetic card reader according to claim 10, wherein said magnetic read head comprises, in addition to said TMR magnetic sensor:
 a second printed-circuit board comprising a reception portion on which there is mounted said TMR magnetic sensor, and a connecting portion for electrical connection of said magnetic read head; and
 a holding device, fixedly attached to said reception portion, said holding device comprising a fixing element to mechanically fix said magnetic read head.

15. The magnetic card reader according to claim 10, further comprising an overlaying element overlaying said TMR magnetic sensor.

16. The magnetic card reader according to claim 15 wherein said overlaying element is a polyimide film.

17. The magnetic card reader according to claim 15 wherein said overlaying element takes the form of a protective capsule that encapsulates said TMR magnetic sensor, said capsule taking the form of a metallic cap, or being formed by injection of plastic material, resin or ceramic.

18. The magnetic card reader according to claim 15 wherein said overlaying element takes the form of a folded-back portion of a flexible printed-circuit board on said TMR magnetic sensor.

19. The magnetic card reader according to claim 18 wherein said folded-back portion comprises at least one electrostatic discharge track.

20. A magnetic card reader comprising:
 a groove configured to enable shifting of a magnetic card in the groove;
 a first printed-circuit board;
 a magnetic read head mounted on the first printed-circuit board so as to enable reading of a magnetic stripe of the magnetic card, wherein said magnetic read head comprises a tunnel magnetoresistance sensor called a TMR magnetic sensor positioned in a recess of a side wall of said groove; and
 at least one electrostatic discharge track comprised on said first printed-circuit board and positioned in said recess, about said TMR magnetic sensor.

* * * * *